(12) United States Patent
Shin et al.

(10) Patent No.: US 8,902,021 B2
(45) Date of Patent: Dec. 2, 2014

(54) RADIO FREQUENCY FILTER AND RADIO FREQUENCY DUPLEXER INCLUDING BULK ACOUSTIC WAVE RESONATORS IN A LADDER AND A BRIDGE

(75) Inventors: Jea Shik Shin, Hwaseong-si (KR); Soo Chul Kim, Hwaseong-si (KR); In Sang Song, Osan-si (KR); Young Il Kim, Suwon-si (KR); Duck Hwan Kim, Goyang-si (KR); Hyung Rak Kim, Seoul (KR); Jae Chun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 670 days.

(21) Appl. No.: 13/108,822

(22) Filed: May 16, 2011

(65) Prior Publication Data

US 2012/0013419 A1 Jan. 19, 2012

(30) Foreign Application Priority Data

Jul. 19, 2010 (KR) .......................... 10-2010-0069571

(51) Int. Cl.
*H03H 9/70* (2006.01)
*H03H 9/54* (2006.01)

(52) U.S. Cl.
CPC ............... *H03H 9/706* (2013.01); *H03H 9/542* (2013.01)
USPC ........................................ 333/133; 333/189

(58) Field of Classification Search
USPC .......................................... 333/133, 187–190
See application file for complete search history.

(56) References Cited

U.S. PATENT DOCUMENTS

| | | | | |
|---|---|---|---|---|
| 2,037,171 A * | 4/1936 | Lane | ............................. | 333/190 |
| 2,980,872 A * | 4/1961 | Storch | ........................... | 333/190 |
| 6,246,148 B1 * | 6/2001 | Flowers et al. | ............ | 310/313 B |
| 6,535,080 B2 * | 3/2003 | Taniguchi | ..................... | 333/193 |
| 6,542,055 B1 * | 4/2003 | Frank et al. | .................... | 333/189 |
| 6,600,390 B2 * | 7/2003 | Frank | ............................ | 333/189 |
| 7,102,460 B2 * | 9/2006 | Schmidhammer et al. | ... | 333/133 |
| 7,135,940 B2 * | 11/2006 | Kawakubo et al. | .......... | 333/17.1 |

(Continued)

FOREIGN PATENT DOCUMENTS

| | | |
|---|---|---|
| JP | 2006-074749 | 3/2006 |
| JP | 2009-272666 | 11/2009 |

(Continued)

OTHER PUBLICATIONS

S. Giraud et al.; "Bulk Acoustic Wave Filters Synthesis and Optimization for Multi-Standard Communication Terminals"; IEEE Transactions on Ultrasonics, Ferroelectrics, and Frequency Control, vol. 57, No. 1, Jan. 2010, pp. 52-58.*

(Continued)

*Primary Examiner* — Barbara Summons
(74) *Attorney, Agent, or Firm* — NSIP Law

(57) ABSTRACT

A Radio Frequency (RF) duplexer including Bulk Acoustic Wave Resonators (BAWRs) and an RF filter including BAWRs are provided. The RF duplexer may convert the received signal into a balance signal and output the balance signal via a dual-output port. The RF duplexer may also include a BAWR receiving filter unit including an input end to receive the balance signal from the dual-output port, and an output end used for dual output. The RF duplexer may also include a BAWR transmitting filter unit to transmit a transmitted signal to the antenna via a single-output port.

16 Claims, 16 Drawing Sheets

(56) References Cited

U.S. PATENT DOCUMENTS

| | | |
|---|---|---|
| 7,283,016 B2 | 10/2007 | Haruta et al. |
| 7,554,419 B2 | 6/2009 | Inoue et al. |
| 2003/0042992 A1* | 3/2003 | Frank .............................. 333/26 |
| 2003/0179053 A1* | 9/2003 | Aigner et al. ................. 333/189 |
| 2003/0227357 A1* | 12/2003 | Metzger et al. ............... 333/189 |
| 2005/0068125 A1* | 3/2005 | Unterberger et al. ......... 333/190 |
| 2005/0151600 A1* | 7/2005 | Takeuchi et al. .............. 333/191 |
| 2006/0139120 A1* | 6/2006 | Yamaguchi et al. ........... 333/133 |
| 2008/0272853 A1* | 11/2008 | Heinze et al. ................. 333/129 |
| 2010/0109800 A1* | 5/2010 | Ueda et al. .................... 333/132 |
| 2011/0032053 A1* | 2/2011 | Park et al. ..................... 333/189 |

FOREIGN PATENT DOCUMENTS

| | | |
|---|---|---|
| KR | 10-2003-0087729 | 11/2003 |
| KR | 10-2007-0017926 | 2/2007 |
| WO | WO2004/066494 A1 * | 8/2004 |
| WO | WO 2006/018788 A1 * | 2/2006 |

OTHER PUBLICATIONS

H. Jin et al.; "Design of Balanced RF Filter for Wireless Applications Using FBAR Technology"; 2005 IEEE Conference on Electronic Devices and Solid-State Circuits, 2005, pp. 57-60 and one IEEE Xplore abstract page.*

H.K.J. ten Dolle et al.; "Balanced Lattice-Ladder Bandpass Filter in Bulk Acoustic Wave Technology"; 2004 IEEE MTT-S International Microwave Symposium Digest, Jun. 6-11, 2004, vol. 1, pp. 391-394 and one IEEE Xplore abstract page.*

A.A. Shirakawa et al.; "A High Isolation and High Selectivity Ladder-Lattice BAW-SMR Filter"; Proceedings of the 36th European Microwave Conference, Sep. 2006, pp. 905-908.*

* cited by examiner

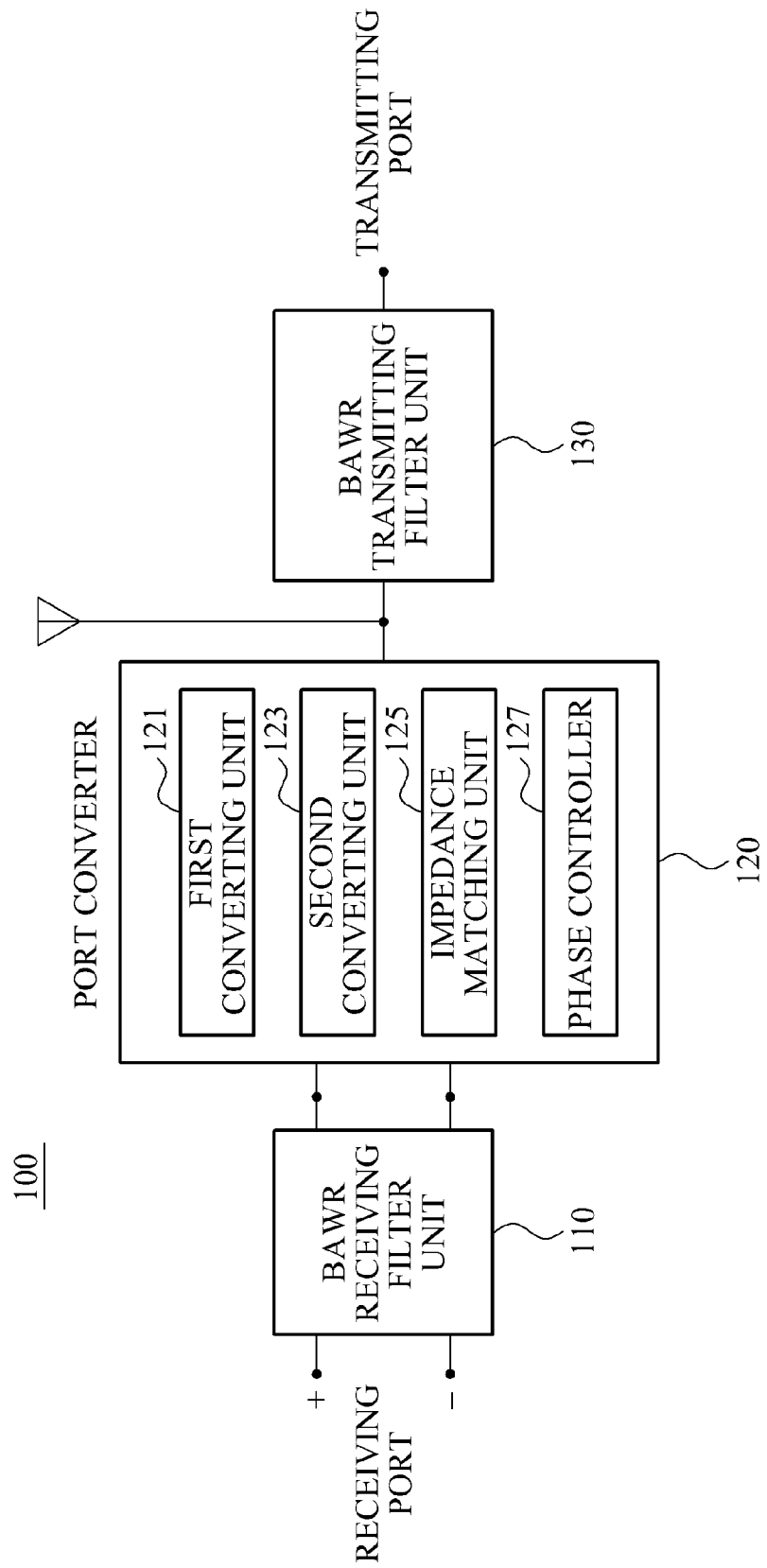

RADIO FREQUENCY FILTER AND RADIO
FREQUENCY DUPLEXER INCLUDING BULK
ACOUSTIC WAVE RESONATORS IN A
LADDER AND A BRIDGE

CROSS-REFERENCE TO RELATED
APPLICATION(S)

This application claims the benefit under 35 U.S.C. §119(a) of Korean Patent Application No. 10-2010-0069571, filed on Jul. 19, 2010, in the Korean Intellectual Property Office, the entire disclosure of which is incorporated herein by reference for all purposes.

BACKGROUND

1. Field

The following description relates to a Radio Frequency (RF) duplexer including Bulk Acoustic Wave Resonators (BAWRs) and an RF filter including BAWRs.

2. Description of Related Art

Mobile transmitting and receiving apparatuses are sensitive to noise characteristics of received signals. The noise characteristics of the received signals may be compensated for by processing the received signals to be balance signals.

A scheme for processing a received signal to be a balance signal includes dividing a single signal into balance signals using a receiving port of a Radio Frequency (RF) duplexer that includes a single type output end, or by additionally using a balun. However, the use of the single type output end complicates implementation in hardware, and the use of the balun incurs additional costs.

SUMMARY

In one general aspect, there is provided a Radio Frequency (RF) duplexer using Bulk Acoustic Wave Resonators (BAWRs), the RF duplexer including a port converter to receive a signal from an antenna via a single-input port, to convert the received signal into a balance signal, and to output the balance signal via a dual-output port, a BAWR receiving filter unit comprising an input end to receive the balance signal from the dual-output port, and an output end used for dual output, and a BAWR transmitting filter unit to transmit a signal to the antenna via a single-output port.

The BAWR receiving filter unit may further comprise at least one ladder comprising a plurality of BAWRs, and a bridge comprising a plurality of BAWRs.

The at least one ladder may comprise a first BAWR and a second BAWR configured in series, and a third BAWR comprising a first end connected to an output end of the first BAWR, and a second end connected to an output end of the second BAWR.

The bridge may comprise a first BAWR and a second BAWR configured in series, a third BAWR comprising a first end connected to an input end of the first BAWR, and a second end connected to an output end of the second BAWR, and a fourth BAWR comprising a first end connected to an output end of the first BAWR, and a second end connected to an input end of the second BAWR.

The at least one ladder may comprise a first BAWR and a second BAWR configured in series, and a plurality of BAWRs configured in parallel, wherein an inductor is connected between the plurality of BAWRs configured in parallel, a first end of a first BAWR from among the plurality of BAWRs configured in parallel is connected to an output end of the first BAWR configured in series, and a first end of a last BAWR from among the plurality of BAWRs configured in parallel is connected to an output end of the second BAWR.

The at least one ladder may comprise a first BAWR and a second BAWR configured in series, and a plurality of BAWRs configured in parallel, wherein a first end of one BAWR of neighboring BAWRs from among the plurality of BAWRs configured in parallel is connected to a first end of another BAWR of the neighboring BAWRs, a second end of a first BAWR from among the neighboring BAWRs is connected to an output end of the first BAWR configured in series, and a second end of a last BAWR among the neighboring BAWRs is connected to an output end of the second BAWR.

The bridge may comprise a first BAWR and a second BAWR configured in series, a third BAWR, a fourth BAWR, a first capacitor comprising a first end connected to an input end of the first BAWR, and a second end connected to a first end of the third BAWR, and a second capacitor comprising a first end connected to an output end of the first BAWR, and a second end connected to a first end of the fourth BAWR, wherein a second end of the third BAWR is connected to an output end of the second BAWR, and a second end of the fourth BAWR is connected to an input end of the second BAWR.

The port converter may comprise a first converting unit to convert the signal input via the signal input port into a first balance signal, and a second converting unit to convert the signal input via the signal input port into a second balance signal corresponding to the first balance signal.

The first converting unit may comprise a first inductor, a first capacitor, and a second capacitor that form a PI-type circuit.

The first converting unit may comprise a first capacitor, a first inductor, and a second inductor that form a PI-type circuit.

The second converting unit may comprise a first capacitor, a second capacitor, and a first inductor that form a T-type circuit.

The second converting unit may comprise a first inductor, a second inductor, and a first capacitor that form a T-type circuit.

The port converter may further comprise a capacitor comprising a first end connected to an output end of the first converting unit, and a second end connected to an output end of the second converting unit.

The port converter may further comprise an impedance matching unit to match an internal impedance to a predetermined impedance, based on a relationship with the antenna, and a phase controller to control a phase of the signal received from the antenna.

The BAWR transmitting filter unit may comprise at least one ladder comprising a plurality of BAWRs.

The at least one ladder may comprise a first BAWR configured in series, and a second BAWR comprising a first end connected to an output end of the first BAWR, and a second end connected to a first end of an inductor, wherein a second end of the inductor is connected to the ground.

The at least one ladder may comprise a first BAWR configured in series, a second BAWR comprising a first end connected to an output end of the first BAWR, and a second end connected to a first end of a first inductor, a third BAWR comprising a first end connected to an input end of the first BAWR, and a second end connected to a first end of a second inductor, and a third inductor comprising a first end connected to a second end of the first inductor and to a second end of the second inductor, and a second end connected to the ground.

In another aspect, there is provided a Radio Frequency (RF) filter including Bulk Acoustic Wave Resonators (BAWRs), the RF filter including an input end to receive a first balance signal and a second balance signal, the second balance signal having a phase that is opposite to a phase of the first balance signal, a bridge comprising a plurality of BAWRs connected to the input end, and at least one ladder comprising a plurality of BAWRs connected to the bridge, wherein the at least one ladder comprises two output ports.

Other features and aspects may be apparent from the following detailed description, the drawings, and the claims.

BRIEF DESCRIPTION OF THE DRAWINGS

FIG. 1 is a diagram illustrating an example of a Radio Frequency (RF) duplexer including Bulk Acoustic Wave Resonators (BAWRs).

Figure 2A:
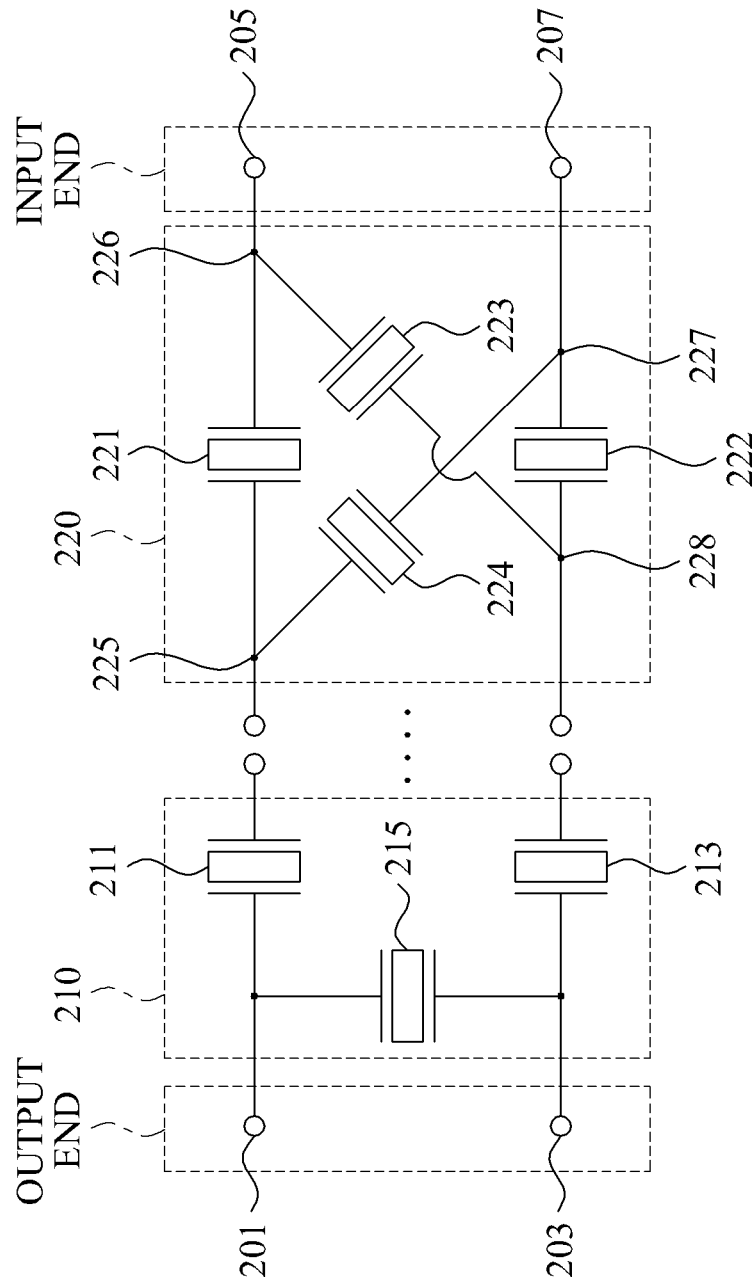
FIGS. 2A through 2D are diagrams illustrating examples of at least one ladder and a bridge that are included in a BAWR receiving filter unit.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, description of well-known functions and constructions may be omitted for increased clarity and conciseness.

According to various embodiments, a Radio Frequency (RF) duplexer and an RF filter including Bulk Acoustic Wave Resonators (BAWRs) may be included in a terminal such as a mobile device, and the like, and may be applied to a wireless mobile communication service field. Additionally, the RF duplexer and the RF filter may separate and filter a transmitted signal and a received signal in the mobile device, in the same manner as an RF transceiver.

FIG. 1 illustrates an example of an RF duplexer 100 that includes BAWRs.

Referring to FIG. 1, the RF duplexer 100 includes a BAWR receiving filter unit 110, a port converter 120, and a BAWR transmitting filter unit 130.

The BAWR receiving filter unit 110 may include a plurality of BAWRs that are configured in series and/or in parallel. For example, an input end of the BAWR receiving filter unit 110 may include two input ports used for dual input, and an output end of the BAWR receiving filter unit 110 may include two output ports used for dual output.

In this example, the input end of the BAWR receiving filter unit 110 for dual input is connected to a dual-output port of the port converter 120, and is used to receive a balance signal. The output end of the BAWR receiving filter unit 110 for dual output is connected to a receiving port. A portion of the plurality of BAWRs may form a bridge, and the remaining BAWRs may form at least one ladder. The bridge and the at least one ladder are further described with reference to FIGS. 2A through 2D.

The port converter 120 may receive a signal via a single-input port from an antenna. Additionally, the port converter 120 may convert the received signal into a balance signal. In this example, the balance signal refers to a signal that includes a received signal and a signal that has a phase that is opposite to a phase of the received signal, and that may be used to minimize a noise of the received signal. In addition, the port converter 120 may output the balance signal via the dual-output port. In other words, the port converter 120 may output the signal received from the antenna and a signal having a phase opposite to a phase of the received signal, via the dual-output port.

The port converter 120 may include a first converting unit 121 and a second converting unit 123. The first converting unit 121 may convert a signal that is input via the signal-input port into a first balance signal, and the second converting unit 123 may convert the signal that is input via the signal-input port into a second balance signal that corresponds to the first balance signal. For example, the second balance signal corresponding to the first balance signal may have a phase that is opposite to the phase of the first balance signal.

In certain aspects, the first converting unit 121 and the second converting unit 123 may include a PI-type circuit and/or a T-type circuit that is formed by a combination of inductors and capacitors. A structure of the PI-type circuit and the T-type circuit is further described with reference to FIGS. 3A through 3D, and FIGS. 4A through 4D.

The port converter 120 may further include an impedance matching unit 125 and a phase controller 127.

The impedance matching unit 125 may match an internal impedance to a predetermined impedance, based on a relationship with the antenna. The internal impedance may include an impedance of a receiving end connected to the receiving port, and an impedance of a transmitting end connected to a transmitting port. For example, the impedance matching unit 125 may perform impedance matching such that the receiving end and the transmitting end have infinite impedances. Additionally, the impedance matching unit 125 may perform impedance matching such that the receiving end and the transmitting end may have a predetermined value in relation to the antenna.

The phase controller 127 may control a phase of the signal that is received from the antenna. The phase controller 127 may control a phase of a received signal, such that a phase of a signal output to the receiving end may be different by 180° from a phase of a signal input to the transmitting end.

The BAWR transmitting filter unit 130 may be connected to the transmitting port via the single-input port, and may transmit a transmitted signal to the antenna via a single-output port. As an example, the BAWR transmitting filter unit 130 may be implemented as a ladder including a plurality of BAWRs and a plurality of passive devices. A structure of the ladder in the BAWR transmitting filter unit 130 is further described below with reference to FIGS. 5A and 5B.

FIGS. 2A through 2D illustrate examples of at least one ladder and a bridge that may be included in a BAWR receiving filter unit. That is, the BAWR receiving filter unit may include at least one ladder and at least one bridge.

Referring to the example shown in FIG. 2A, a BAWR receiving filter unit includes a ladder 210, and a bridge 220.

The ladder 210 includes a first BAWR 211 and a second BAWR 213 that are configured in series. In this example, the ladder 210 further includes a third BAWR 215 that has a first end connected to an output end 201 of the first BAWR 211, and a second end connected to an output end 203 of the second BAWR 213.

The bridge 220 includes a fourth BAWR 221, a fifth BAWR 222, a sixth BAWR 223, and a seventh BAWR 224. In this example, the fourth BAWR 221 and the fifth BAWR 222 are configured in series. The sixth BAWR 223 has a first end 226 connected to an input end 205 of the fourth BAWR 221, and a second end 228 connected to an output end of the fifth BAWR 222. The seventh BAWR 224 has a first end 225 connected to an output end of the fourth BAWR 221, and a second end 227 connected to an input end 207 of the fifth BAWR 222.

In this example, the input end 205 of the fourth BAWR 221, and the input end 207 of the fifth BAWR 222 may be configured as an input end for dual input. The output end 201 of the first BAWR 211, and the output end 203 of the second BAWR 213 may be configured as an output end for dual output. In this example, the bridge 220 and the ladder 210 may be configured to enable a signal to be input in an order from the bridge 220 to the ladder 210. Additionally, the bridge 220 and the ladder 210 may be configured such that the output end of each of the fourth BAWR 221 and the fifth BAWR 222 are connected to the input end of each of the first BAWR 211 and the second BAWR 213.

Figure 2B:
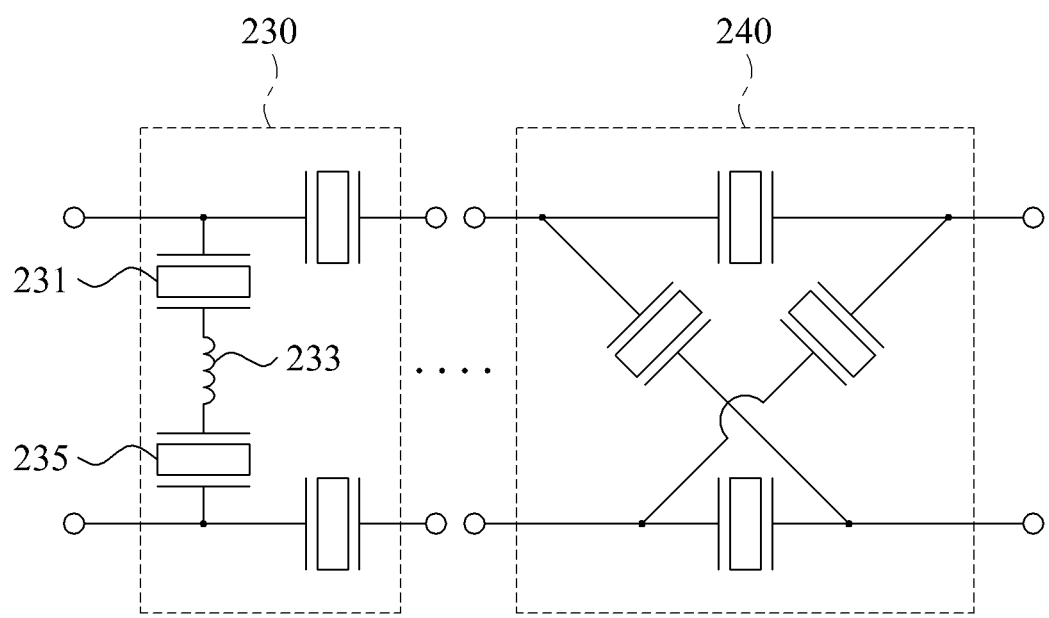

Referring to the example shown in FIG. 2B, a BAWR receiving filter unit includes a ladder 230, and a bridge 240.

The ladder 230 includes a first BAWR and a second BAWR that are configured in series, and a third BAWR 231 and a fourth BAWR 235 that are configured in parallel. In this example, an inductor 233 is connected between the third BAWR 231 and the fourth BAWR 235 that are configured in parallel. A first end of the third BAWR 231 is connected to an output end of the first BAWR, and a first end of the fourth BAWR 235 is connected to an output end of the second BAWR.

The bridge 240 includes a fifth BAWR, a sixth BAWR, a seventh BAWR, and an eighth BAWR. Similar to the bridge 220 shown in FIG. 2A, fifth BAWR and the sixth BAWR are configured in series. The seventh BAWR has a first end connected to an input end of the fifth BAWR, and a second end connected to an output end of the sixth BAWR. The eighth BAWR has a first end connected to an output end of the fifth BAWR, and a second end connected to an input end of the sixth BAWR.

For example, the input end of the fifth BAWR and the input end of the sixth BAWR may be configured as an input end for dual input. The output end of the first BAWR and the output end of the second BAWR may be configured as an output end for dual output. In this example, the bridge 240 and the ladder 230 may be configured to enable a signal to be input in an order from the bridge 240 to the ladder 230. Additionally, the bridge 240 and the ladder 230 may be configured such that the output end of each of the fifth BAWR and the sixth BAWR are connected to the input end of each of the first BAWR and the second BAWR.

Figure 2C:
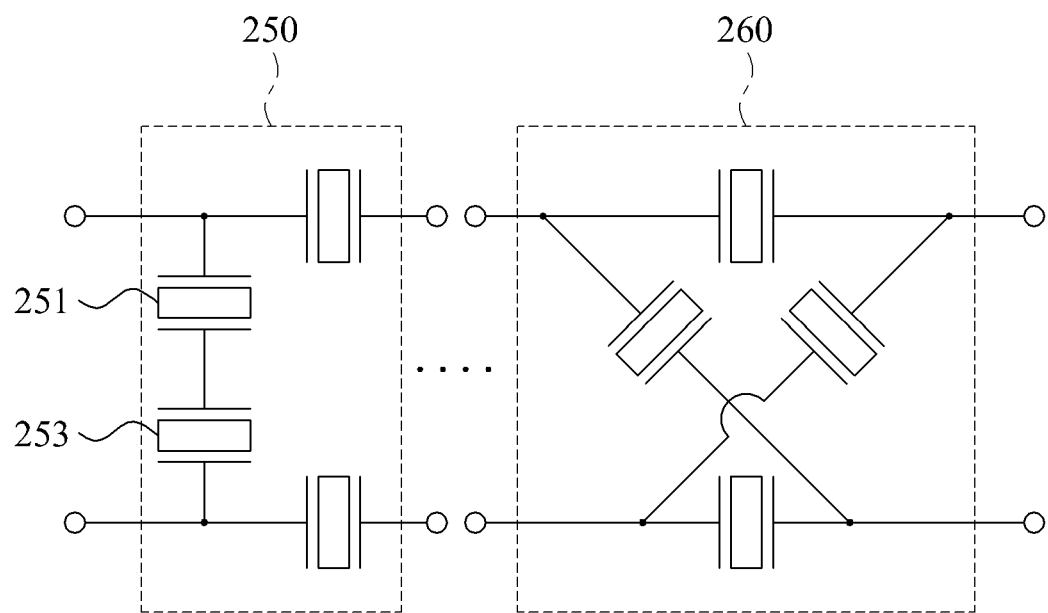

Referring to the example shown in FIG. 2C, a BAWR receiving filter unit includes a ladder 250, and a bridge 260.

In this example, the ladder 250 includes a first BAWR and a second BAWR that are configured in series, and a third BAWR 251 and a fourth BAWR 253 that are configured in parallel. A first end of the third BAWR 251 is connected to a first end of the fourth BAWR 253. A second end of the third BAWR 251 is connected to an output end of the first BAWR, and a second end of the fourth BAWR 253 is connected to an output end of the second BAWR.

Similar to the bridge 220 and the bridge 240, the bridge 260 includes a fifth BAWR, a sixth BAWR, a seventh BAWR, and an eighth BAWR. The fifth BAWR and the sixth BAWR are configured in series. The seventh BAWR has a first end connected to an input end of the fifth BAWR, and a second end connected to an output end of the sixth BAWR. The eighth BAWR has a first end connected to an output end of the fifth BAWR, and a second end connected to an input end of the sixth BAWR.

For example, the input end of the fifth BAWR and the input end of the sixth BAWR may be configured as an input end for dual input. The output end of the first BAWR and the output end of the second BAWR may be configured as an output end for dual output. In this example, the bridge 260 and the ladder 250 may be configured to enable a signal to be input in an order from the bridge 260 to the ladder 250. Additionally, the bridge 260 and the ladder 250 may be configured to connect the output end of each of the fifth BAWR and the sixth BAWR to the input end of each of the first BAWR and the second BAWR.

Figure 2D:
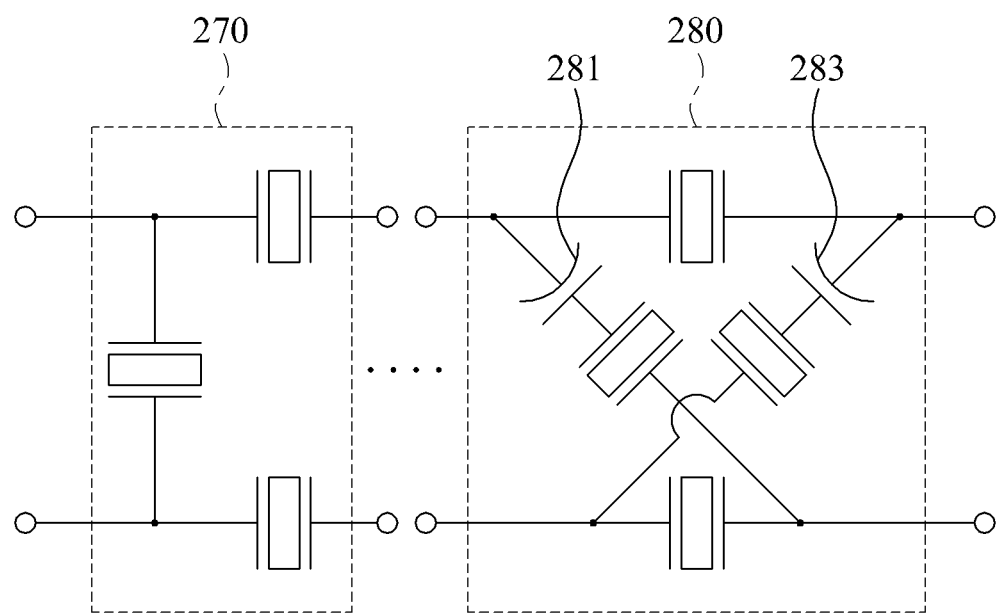

Referring to the example shown in FIG. 2D, a BAWR receiving filter unit includes a ladder 270, and a bridge 280.

The ladder 270 includes a first BAWR and a second BAWR that are configured in series. Additionally, the ladder 270 further includes a third BAWR that has a first end connected to an output end of the first BAWR, and a second end connected to an output end of the second BAWR.

In this example, the bridge 280 includes a fourth BAWR, a fifth BAWR, a sixth BAWR, a seventh BAWR, a first capacitor 283, and a second capacitor 281. The fourth BAWR and the fifth BAWR are configured in series, and the sixth BAWR and the seventh BAWR are configured in parallel.

In this example, the first capacitor 283 has a first end connected to an input end of the fourth BAWR, and a second end connected to a first end of the sixth BAWR. The second capacitor 281 has a first end connected to an output end of the fourth BAWR, and a second end connected to a first end of the seventh BAWR. The first end of the sixth BAWR is connected to the first capacitor 283, and a second end of the sixth BAWR is connected to an output end of the fifth BAWR. The first end of the seventh BAWR is connected to the second capacitor 281, and a second end of the seventh BAWR is connected to an input end of the fifth BAWR.

For example, the input end of the fourth BAWR and the input end of the fifth BAWR may be configured as an input end for dual input. The output end of the first BAWR and the output end of the second BAWR may be configured as an output end for dual output. In this example, the bridge 280 and the ladder 270 may be configured to enable a signal to be input in an order from the bridge 280 to the ladder 270. Additionally, the bridge 280 and the ladder 270 may be configured to connect the output end of each of the fourth BAWR and the fifth BAWR to the input end of each of the first BAWR and the second BAWR.

FIGS. 3A through 3D illustrate examples of the port converter 120 of FIG. 1 including a PI-type circuit and/or a T-type circuit.

Figure 3A:
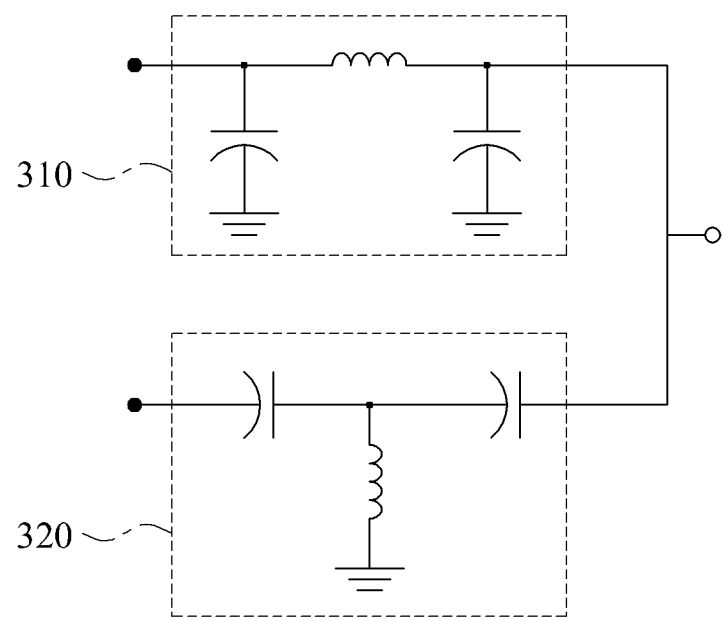
FIGS. 3A through 3D are diagrams illustrating examples of a port converter of FIG. 1 including a PI-type circuit and/or a T-type circuit.

Referring to the example shown in FIG. 3A, a first converting unit 310 includes a PI-type circuit with a first inductor, a first capacitor, and a second capacitor. A second converting unit 320 includes a T-type circuit with a third capacitor, a fourth capacitor, and a second inductor.

Figure 3B:
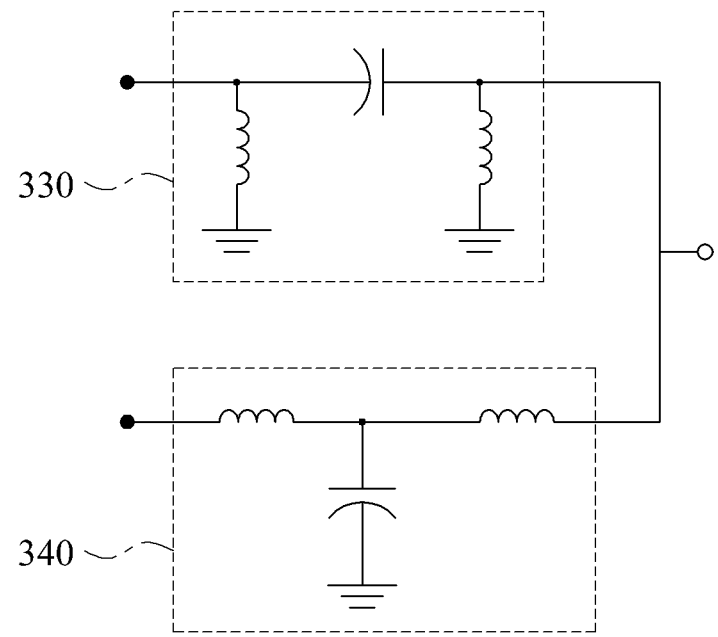

Referring to the example shown in FIG. 3B, a first converting unit 330 includes a PI-type circuit with a first capacitor, a first inductor, and a second inductor. A second converting unit 340 includes a T-type circuit with a third inductor, a fourth inductor, and a second capacitor.

Figure 3C:
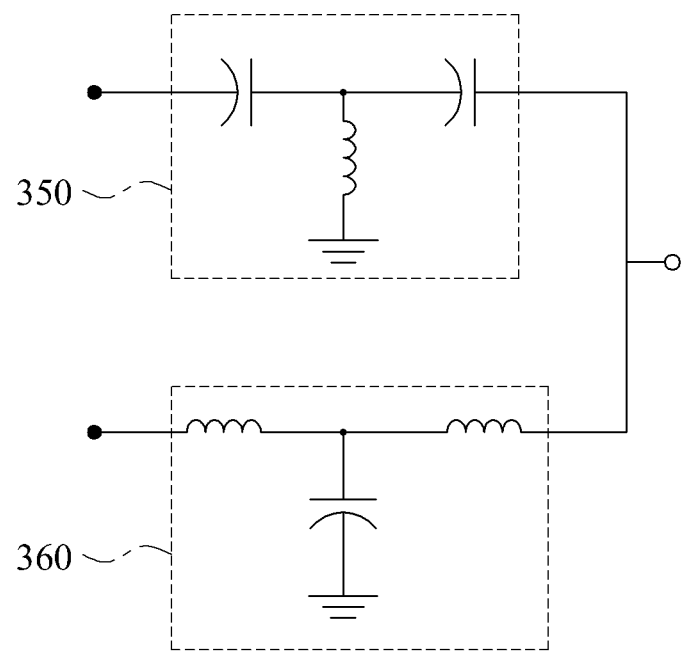

Referring to the example shown in FIG. 3C, a first converting unit 350 includes a T-type circuit with a first capacitor, a second capacitor, and a first inductor. A second converting unit 360 includes a T-type circuit with a second inductor, a third inductor, and a third capacitor.

Figure 3D:
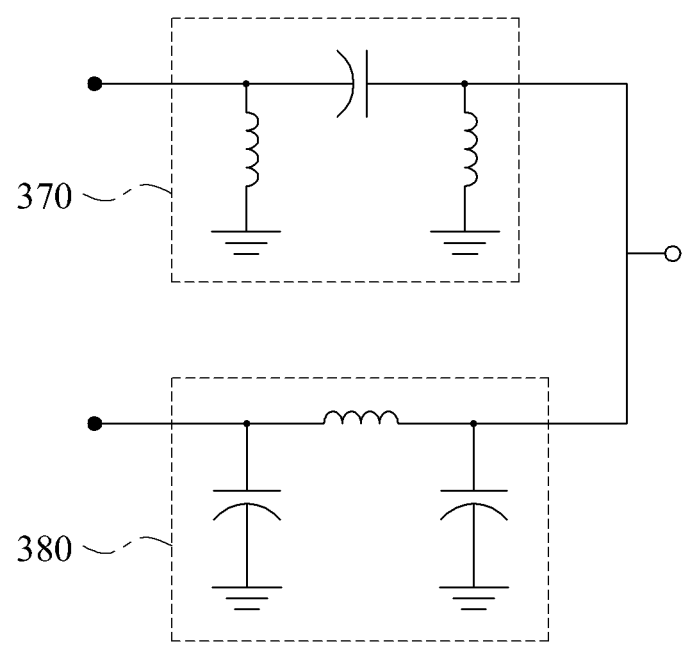

Referring to the example shown in FIG. 3D, a first converting unit 370 includes a PI-type circuit with a first capacitor, a first inductor, and a second inductor. A second converting unit 380 includes a PI-type circuit with a third inductor, a second capacitor, and a third capacitor.

FIGS. 4A through 4D illustrate examples of the port converter 120 of FIG. 1 including a capacitor.

Figure 4A:
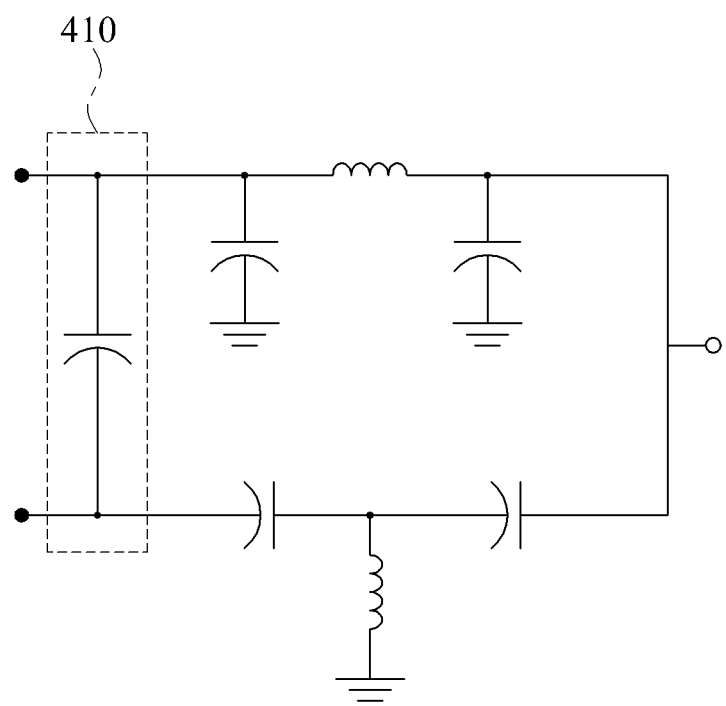
FIGS. 4A through 4D are diagrams illustrating examples of the port converter of FIG. 1 including a capacitor.

Referring to the example shown in FIG. 4A, the port converter 120 may further include a capacitor 410 that has a first end connected to an output end of the first converting unit 310, and a second end connected to an output end of the second converting unit 320 shown in FIG. 3A.

Figure 4B:
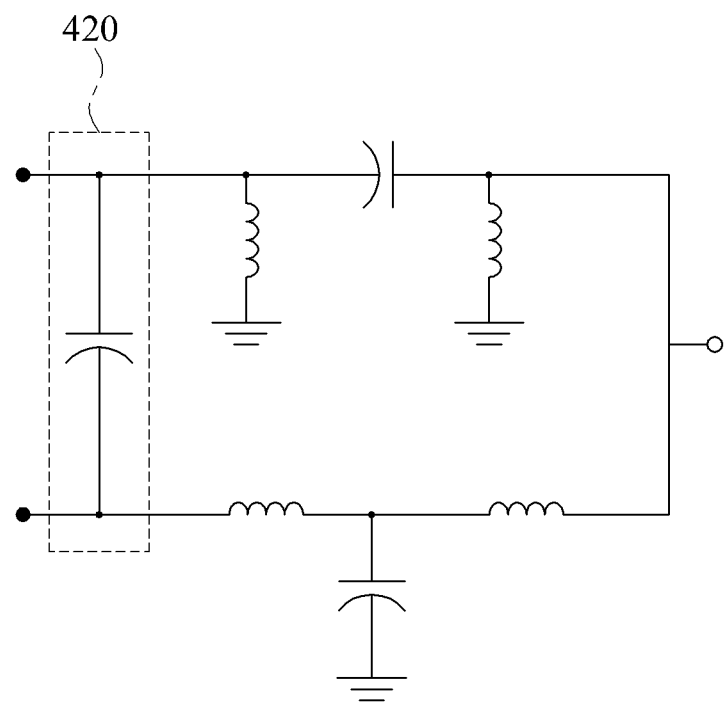

Referring to the example shown in FIG. 4B, the port converter 120 may further include a capacitor 420 that has a first end connected to an output end of the first converting unit 330, and a second end connected to an output end of the second converting unit 340 shown in FIG. 3B.

Figure 4C:
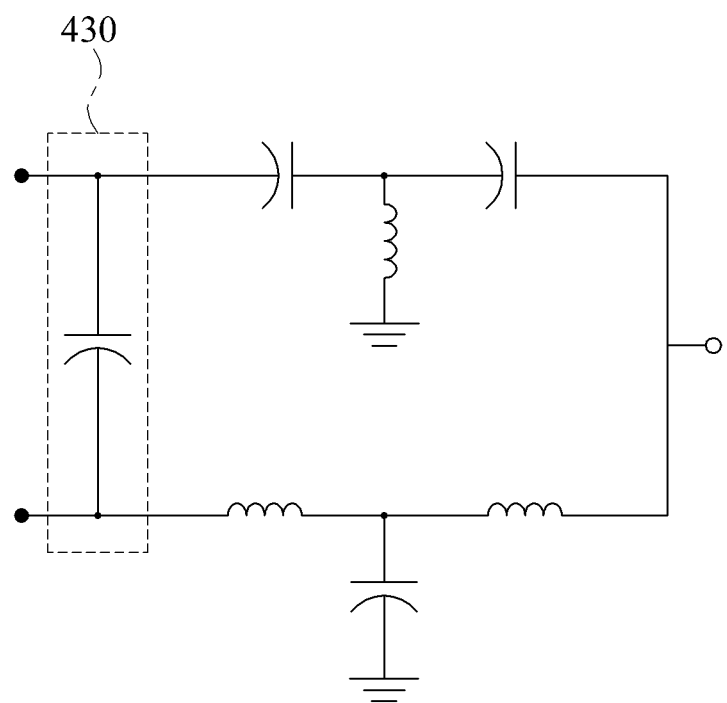

Referring to the example shown in FIG. 4C, the port converter 120 may further include a capacitor 430 that has a first end connected to an output end of the first converting unit 350, and a second end connected to an output end of the second converting unit 360 shown in FIG. 3C.

Figure 4D:
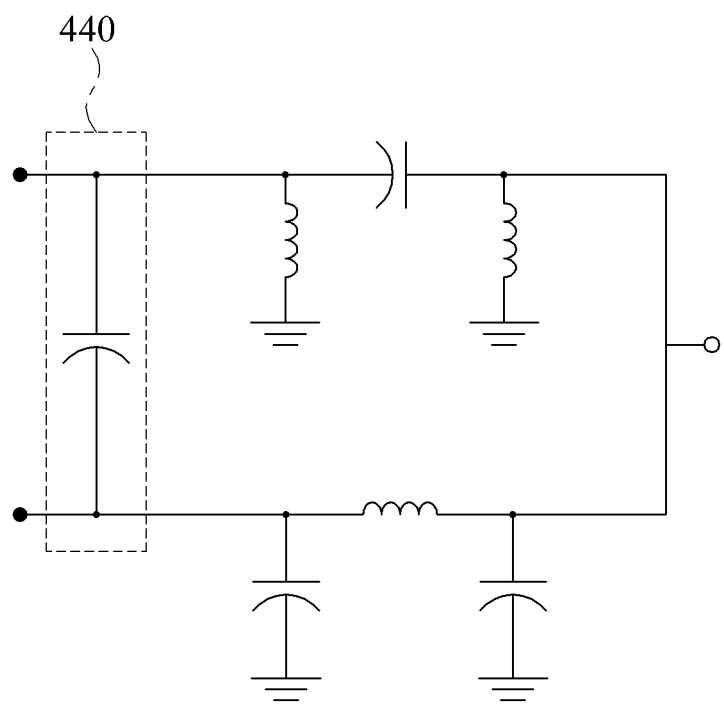

Referring to the example shown in FIG. 4D, the port converter 120 may further include a capacitor 440 that has a first end connected to an output end of the first converting unit 370, and a second end connected to an output end of the second converting unit 380 shown in FIG. 3D.

Figure 5A:
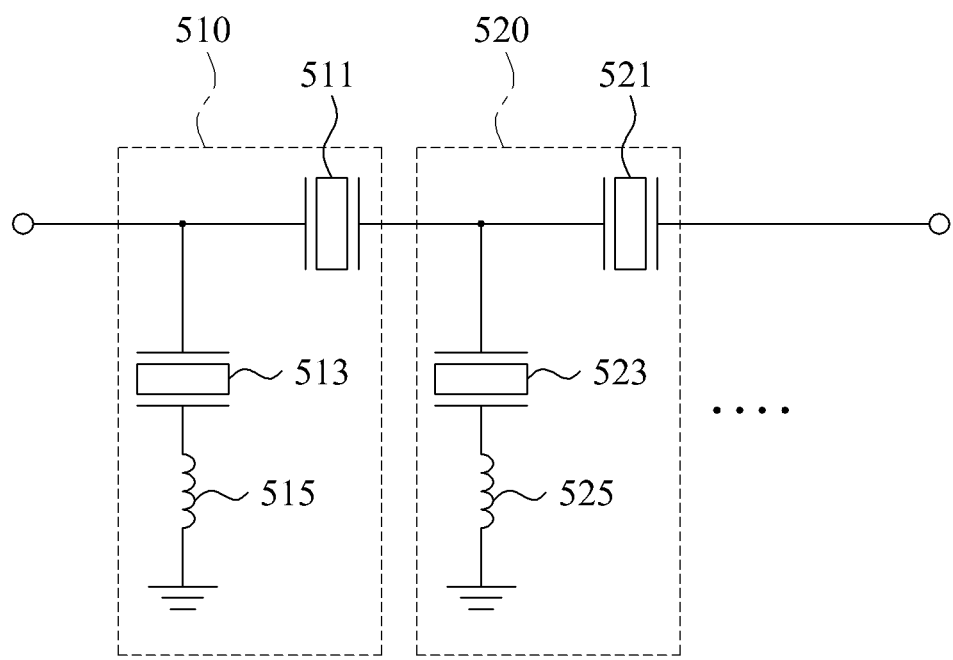
FIGS. 5A and 5B are diagrams illustrating examples of a ladder in a BAWR transmitting filter unit.
Figure 5B:
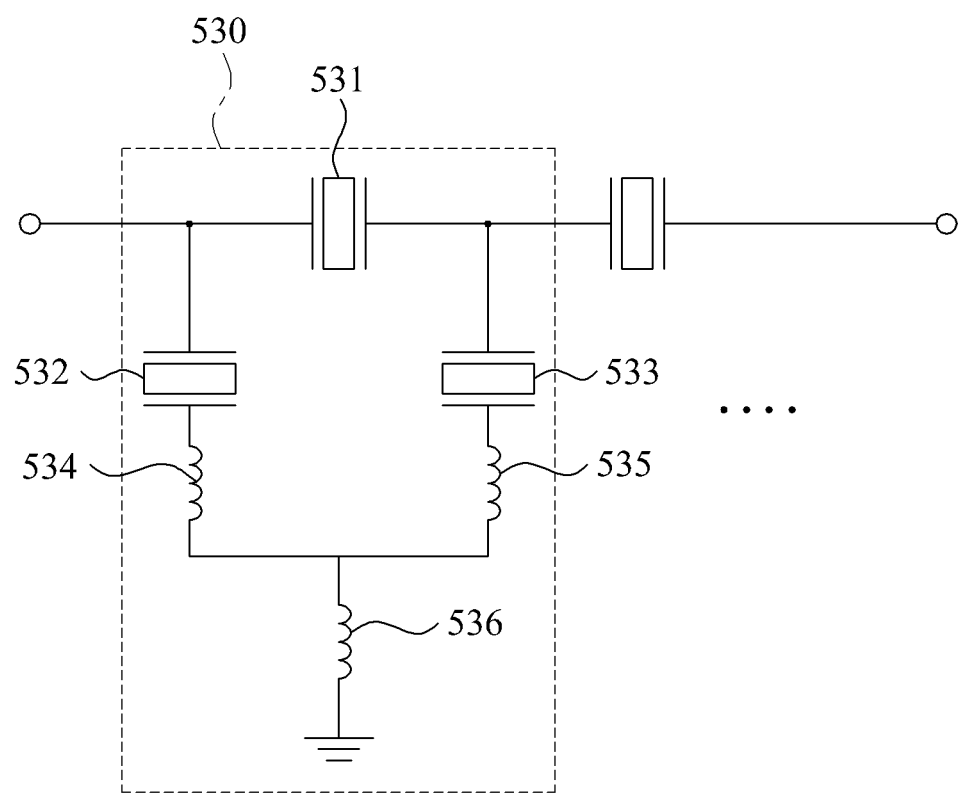

FIGS. 5A and 5B illustrate examples of a ladder in a BAWR transmitting filter unit. The BAWR transmitting filter unit may include at least one ladder.

Referring to the example shown in FIG. 5A, a BAWR transmitting filter unit includes two ladders 510 and 520.

In this example, the ladder 510 includes a first BAWR 511, a second BAWR 513, and a first inductor 515. The first BAWR 511 is configured in series, and the second BAWR 513 has a first end connected to an output end of the first BAWR 511 and a second end connected to a first end of a first inductor 515. Additionally, a second end of the first inductor 515 is connected to ground.

In this example, the ladder 520 includes a third BAWR 521, a fourth BAWR 523, and a second inductor 525. The third BAWR 521 is configured in series, and the fourth BAWR 523 has a first end connected to an output end of the third BAWR 521 and a second end connected to a first end of a second inductor 525. Additionally, a second end of the second inductor 525 is connected to ground.

For example, the ladders 510 and 520 may be configured to connect the output end of the third BAWR 521 to an input end of the first BAWR 511.

Referring to the example shown in FIG. 5B, a BAWR transmitting filter unit includes a ladder 530.

In this example, the ladder 530 includes a first BAWR 531, a second BAWR 532, a third BAWR 533, a first inductor 534, a second inductor 535, and a third inductor 536. The first BAWR 531 is configured in series, and the second BAWR 532 has a first end connected to an output end of the first BAWR 531, and a second end connected to a first end of a first inductor 534. The third BAWR 533 has a first end connected to an input end of the first BAWR 531, and a second end connected to a first end of a second inductor 535. The third inductor 536 has a first end connected to a second end of the first inductor 534 and to a second end of the second inductor 535, and has a second end connected to ground.

Figure 6:
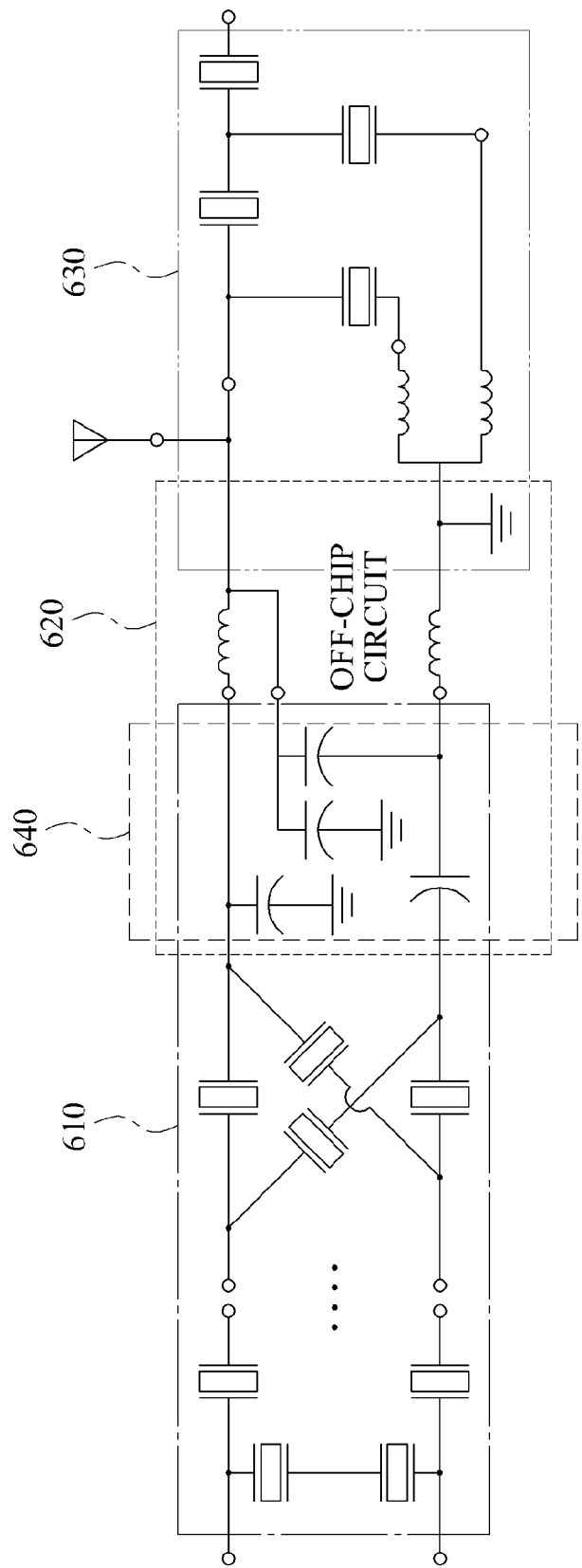
FIG. 6 is a diagram illustrating another example of an RF duplexer including BAWRs.

FIG. 6 illustrates another example of an RF duplexer including BAWRs.

Referring to FIG. 6, the RF duplexer includes a BAWR receiving filter unit 610, a port converter 620, and a BAWR transmitting filter unit 630.

The BAWR receiving filter unit 610 may include at least one ladder and a bridge. Each of the at least one ladder may include a plurality of BAWRs, and the bridge may include a plurality of BAWRs. Examples of ladders and bridges usable in the BAWR receiving filter unit 610 may include those described herein.

The port converting unit 620 may convert a received signal into a balance signal using a T-type circuit or a PI-type circuit that may include at least one inductor and at least one capacitor.

The BAWR transmitting filter unit 630 may include at least one ladder that may include a plurality of BAWRs and a plurality of inductors.

A plurality of capacitors 640 of the port converter 620 may be fabricated during fabrication of the BAWR receiving filter unit 610, and may be implemented in a receiving filter chip. This is because the plurality of capacitors 640 may have a relatively small volume compared to an inductor, and may be relatively easily fabricated during fabrication of the BAWR receiving filter unit 610.

Additionally, at least one inductor in the port converter 620 and the BAWR transmitting filter unit 630 may be fabricated separately from at least one capacitor of the port converter 620, and may be implemented in an off-chip circuit.

As described herein, according to various embodiments, an RF filter using a BAWR may include an input end, a bridge, and at least one ladder. The input end may receive a first balance signal and a second balance signal. For example, a balance signal may generally include a signal received from an antenna, and a signal that has a phase that is opposite to a phase of the received signal. That is, a phase of the first balance signal may be opposite to a phase of the second balance signal. The bridge may include a plurality of BAWRs, and may be connected to the input end. The at least one ladder may include a plurality of BAWRs, and may be connected to the bridge. Additionally, the at least one ladder may include two output ports, such that a balance signal filtered by a receiving filter in a predetermined frequency band may be output via the two output ports.

According to various aspects, in an RF duplexer using a BAWR, an output end of a BAWR receiving filter unit may be configured as an output end for dual output and thus, it is possible to implement a balanced type output end. Furthermore, in the RF duplexer, a port converter may function as a phase shifter and a balun. As a result, it is possible to configure an output end of the BAWR receiving filter unit as a balanced type output end.

According to various aspects, it is possible to mitigate a noise characteristic of a received signal using a radio frequency (RF) duplexer that has a balanced structure using Bulk Acoustic Wave Resonators (BAWRs).

According to various aspects, it is possible to generate a duplexer that has an output end for outputting a received balance signal, using BAWRs, thus improving a performance of the duplexer.

According to various aspects, it is possible to implement a duplexer using an RF duplexer having a balanced structure using a BAWR, without using an additional devices such as a phase shifter and/or a balun that are used to constitute the duplexer.

According to various aspects, it is possible to connect an inductor between two BAWRs that are connected in parallel in a BAWR receiving filter unit, thus improving a characteristic of filtering a received signal, and a characteristic of isolating a receiving end and a transmitting end. A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A Radio Frequency (RF) duplexer using Bulk Acoustic Wave Resonators (BAWRs), the RF duplexer comprising:
   a port converter configured to receive a signal from an antenna via a single-input port, to convert the received signal into a balance signal, and to output the balance signal via a dual-output port; and
   a BAWR receiving filter unit comprising an input end comprising a dual-input port to receive the balance signal from the dual-output port, and an output end comprising a dual-output port for dual output,
   wherein the BAWR receiving filter unit further comprises a ladder and a bridge,
   the bridge comprising:
      a first BAWR configured in series between a first input port of the dual-input port of the BAWR receiving filter unit and a first output port of the dual-output port of the BAWR receiving filter unit;
      a second BAWR configured in series between a second input port of the dual-input port of the BAWR receiving filter unit and a second output port of the dual-output port of the BAWR receiving filter unit;
      a third BAWR;
      a fourth BAWR;
      a first capacitor comprising a first end directly connected to an input end of the first BAWR, and a second end directly connected to a first end of the third BAWR; and
      a second capacitor comprising a first end directly connected to an output end of the first BAWR, and a second end directly connected to a first end of the fourth BAWR,
   wherein a second end of the third BAWR is directly connected to an output end of the second BAWR, and a second end of the fourth BAWR is directly connected to an input end of the second BAWR.

2. The RF duplexer of claim 1, further comprising:
   a BAWR transmitting filter unit to transmit a signal to the antenna via a single-output port.

3. The RF duplexer of claim 2, wherein the BAWR transmitting filter unit comprises:
   a ladder comprising BAWRs.

4. The RF duplexer of claim 3, wherein the ladder comprises:
   a seventh BAWR configured to be connected in series to the single-output port; and
   an eighth BAWR comprising a first end connected to an output end of the seventh BAWR, and a second end connected to a first end of an inductor,
   wherein a second end of the inductor is connected to the ground.

5. The RF duplexer of claim 3, wherein the ladder comprises:
   a seventh BAWR configured to be connected in series to the single-output port;
   an eighth BAWR comprising a first end connected to an output end of the seventh BAWR, and a second end connected to a first end of a first inductor;
   a ninth BAWR comprising a first end connected to an input end of the seventh BAWR, and a second end connected to a first end of a second inductor; and
   a third inductor comprising a first end connected to a second end of the first inductor and to a second end of the second inductor, and a second end connected to the ground.

6. The RF duplexer of claim 1, wherein the ladder comprises:
   a fifth BAWR configured in series between the first input port and the first output port;
   a sixth BAWR configured in series between the second input port and the second output port; and
   a plurality of BAWRs configured to be connected in parallel to the fifth BAWR and the sixth BAWR, the plurality of BAWRs being connected to each other in series.

7. The RF duplexer of claim 6, wherein an inductor is connected between a pair of the plurality of BAWRs.

8. The RF duplexer of claim 1, wherein the port converter comprises:
   a first converting unit to convert the signal input via the signal input port into a first balance signal;
   a second converting unit to convert the signal input via the signal input port into a second balance signal corresponding to the first balance signal; and
   a capacitor comprising a first end connected to an output end of the first converting unit, and a second end connected to an output end of the second converting unit.

9. The RF duplexer of claim 8, wherein the first converting unit comprises a first inductor, a first capacitor, and a second capacitor that form a PI-type circuit.

10. The RF duplexer of claim 8, wherein the first converting unit comprises a first capacitor, a first inductor, and a second inductor that form a PI-type circuit.

11. The RF duplexer of claim 8, wherein the second converting unit comprises a first capacitor, a second capacitor, and a first inductor that form a T-type circuit.

12. The RF duplexer of claim 8, wherein the second converting unit comprises a first inductor, a second inductor, and a first capacitor that form a T-type circuit.

13. The RF duplexer of claim 1, wherein the port converter further comprises:
   an impedance matching unit to match an internal impedance to a predetermined impedance, based on a relationship with the antenna; and
   a phase controller to control a phase of the signal received from the antenna.

14. A Radio Frequency (RF) filter including Bulk Acoustic Wave Resonators (BAWRs), the RF filter comprising:
   an input end configured to receive a first balance signal and a second balance signal, the second balance signal having a phase that is opposite to a phase of the first balance signal;

a bridge connected to the input end; and
a ladder comprising two output ports and BAWRs connected to the bridge, the ladder comprising:
  a first BAWR configured to be connected in series to the first output port;
  a second BAWR configured to be connected in series to the second output port; and
  a plurality of BAWRs configured to be connected in parallel to the first BAWR and the second BAWR, the plurality of BAWRs being connected to each other in series;
the bridge comprising:
  a third BAWR configured in series between a first input port of a dual-input port of a BAWR receiving filter unit and a first output port of a dual-output port of the BAWR receiving filter unit;
  a fourth BAWR configured in series between a second input port of the dual-input port of the BAWR receiving filter unit and a second output port of the dual-output port of the BAWR receiving filter unit;
  a fifth BAWR;
  a sixth BAWR;
  a first capacitor comprising a first end directly connected to an input end of the third BAWR, and a second end directly connected to a first end of the fifth BAWR; and
  a second capacitor comprising a first end directly connected to an output end of the third BAWR, and a second end directly connected to a first end of the sixth BAWR,
  wherein a second end of the fifth BAWR is directly connected to an output end of the fourth BAWR, and a second end of the sixth BAWR is directly connected to an input end of the fourth BAWR.

15. The RF duplexer of claim 14, wherein an inductor is connected between a pair of the plurality of BAWRs.

16. A Radio Frequency (RF) duplexer using Bulk Acoustic Wave Resonators (BAWRs), the RF duplexer comprising:
  a port converter;
  a BAWR receiving filter unit; and
  a BAWR transmitting filter unit,
  wherein the BAWR receiving filter unit is configured to filter a signal received by an antenna using a ladder comprising a plurality of BAWRs and a bridge comprising a plurality of BAWRs,
the bridge comprising:
  a third BAWR configured in series between a first input port of a dual-input port of the BAWR receiving filter unit and a first output port of a dual-output port of the BAWR receiving filter unit;
  a fourth BAWR configured in series between a second input port of the dual-input port of the BAWR receiving filter unit and a second output port of the dual-output port of the BAWR receiving filter unit;
  a filth BAWR;
  a sixth BAWR;
  a first capacitor comprising a first end directly connected to an input end of the third BAWR, and a second end directly connected to a first end of the fifth BAWR; and
    a second capacitor comprising a first end directly connected to an output end of the third BAWR, and a second end directly connected to a first end of the sixth BAWR,
  wherein a second end of the fifth BAWR is directly connected to an output end of the fourth BAWR, and a second end of the sixth BAWR is directly connected to an input end of the fourth BAWR;
  wherein the BAWR transmitting filter unit is configured to transmit a signal to the antenna using a ladder comprising a plurality of BAWRs,
  wherein the port converter is configured to convert a signal received from the antenna into a balance signal using at least one of a T-type circuit and a PI-type circuit composed of at least one capacitor, and to output the balance signal using a dual-output port.

* * * * *